United States Patent
Olaleye et al.

(10) Patent No.: US 11,431,805 B2
(45) Date of Patent: Aug. 30, 2022

(54) SYSTEMS AND METHODS FOR COMPRESSING SENSOR DATA USING CLUSTERING AND SHAPE MATCHING IN EDGE NODES OF DISTRIBUTED COMPUTING NETWORKS

(71) Applicant: SIGNIFY HOLDING B.V., Eindhoven (NL)

(72) Inventors: Olaitan Philip Olaleye, Wakefield, MA (US); Abhishek Murthy, Arlington, MA (US); Mathan Gopalsamy, Medford, MA (US)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/266,752

(22) PCT Filed: Aug. 5, 2019

(86) PCT No.: PCT/EP2019/071013
§ 371 (c)(1),
(2) Date: Feb. 8, 2021

(87) PCT Pub. No.: WO2020/030584
PCT Pub. Date: Feb. 13, 2020

(65) Prior Publication Data
US 2021/0297491 A1    Sep. 23, 2021

Related U.S. Application Data

(60) Provisional application No. 62/715,462, filed on Aug. 7, 2018.

(30) Foreign Application Priority Data

Aug. 27, 2018   (EP) ..................... 18190898

(51) Int. Cl.
*G06F 15/16* (2006.01)
*H04L 67/125* (2022.01)
(Continued)

(52) U.S. Cl.
CPC ........ *H04L 67/125* (2013.01); *H03M 7/6088* (2013.01); *H04L 41/16* (2013.01); *H04L 43/04* (2013.01)

(58) Field of Classification Search
CPC ....... H04L 41/16; H04L 43/04; H04L 67/125; H04L 69/04; H03M 7/6088
(Continued)

(56) References Cited

U.S. PATENT DOCUMENTS

| | | | |
|---|---|---|---|
| 2003/0046382 A1* | 3/2003 | Nick | G05B 23/0283 709/224 |
| 2009/0009339 A1* | 1/2009 | Gorrell | G06Q 30/02 340/573.1 |

(Continued)

OTHER PUBLICATIONS

Zan Ouyang, et al., "Using Delta Encoding for Compressing Related Web Pates," Dept. of Computer Science, Polytechnic University, Brooklyn, NY, Nov. 2000 (12 Pages).

(Continued)

*Primary Examiner* — Johnny B Aguiar

(57) ABSTRACT

A system and method for compressing sensor data at an edge node of a distributed computing network. The method includes training the edge node to with a plurality of known signal templates. Each known signal template corresponding to a corresponding one of a plurality of events observable by the sensor. A raw data signal is collected by a sensor of the edge node. The raw data signal is classified to one of the known signal templates based on a degree of similarity between the raw data signal and the known signal template. A compression scheme is selected based on the classification (Continued)

of the raw data signal. The raw data signal is compressed in accordance with the compression scheme.

10 Claims, 6 Drawing Sheets

(51) Int. Cl.
  *H03M 7/30* (2006.01)
  *H04L 41/16* (2022.01)
  *H04L 43/04* (2022.01)
(58) Field of Classification Search
  USPC .................................................. 709/224, 247
  See application file for complete search history.

(56) References Cited

U.S. PATENT DOCUMENTS

| | | | | |
|---|---|---|---|---|
| 2011/0092164 | A1* | 4/2011 | Spanhake | H04W 40/10 455/67.11 |
| 2011/0298610 | A1* | 12/2011 | Etkin | H04L 29/08792 340/539.3 |
| 2013/0073261 | A1* | 3/2013 | Kim | G06K 9/6289 702/189 |
| 2014/0049412 | A1 | 2/2014 | Agarwal et al. | |
| 2015/0066435 | A1* | 3/2015 | Basu | H04Q 9/00 702/189 |
| 2015/0254575 | A1* | 9/2015 | Nere | G06N 20/00 706/12 |
| 2015/0269825 | A1 | 9/2015 | Tran | |
| 2016/0322078 | A1* | 11/2016 | Bose | H04N 5/247 |
| 2017/0048660 | A1 | 2/2017 | Srinivasan et al. | |
| 2017/0119283 | A1 | 5/2017 | Ten Kate et al. | |
| 2017/0345282 | A1* | 11/2017 | Farrell | G08B 1/08 |
| 2019/0077506 | A1* | 3/2019 | Shaw | G06Q 20/40145 |

OTHER PUBLICATIONS

Ahmad Akl, et al., "Accelerometer-Based Gesture Recognition Via Dynamic-Time Warping, Affinity Propagation, & Compressive Sensing," Dept. of Electrical and Computer Engineering, University of Toronto, 2010 (4 Pages).

Daoyuan Li, et al., "Sensing By Proxy in Buildings With Agglomerative Clustering of Indoor Temperature Movements," Interdisciplinary Centre for Security, Reliability and Trust (SNT) University of Luxembourg, Luxembourg, 2017 (8 Pages).

* cited by examiner

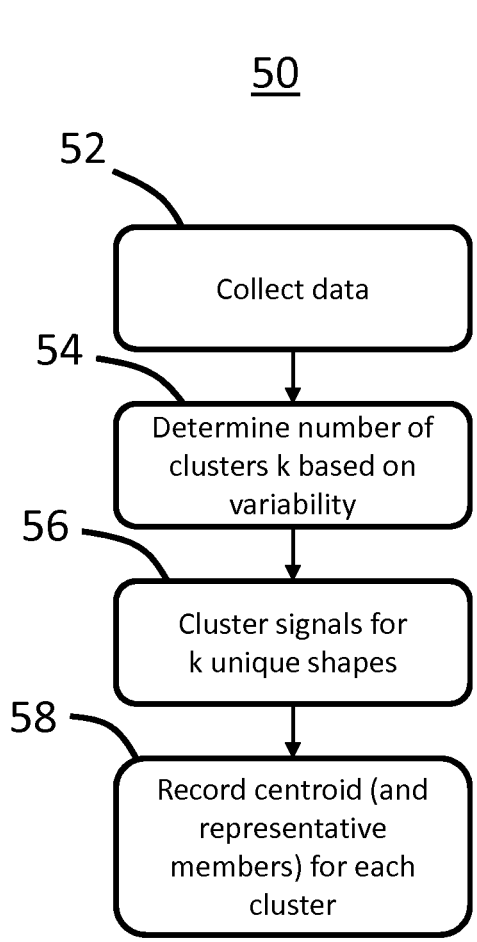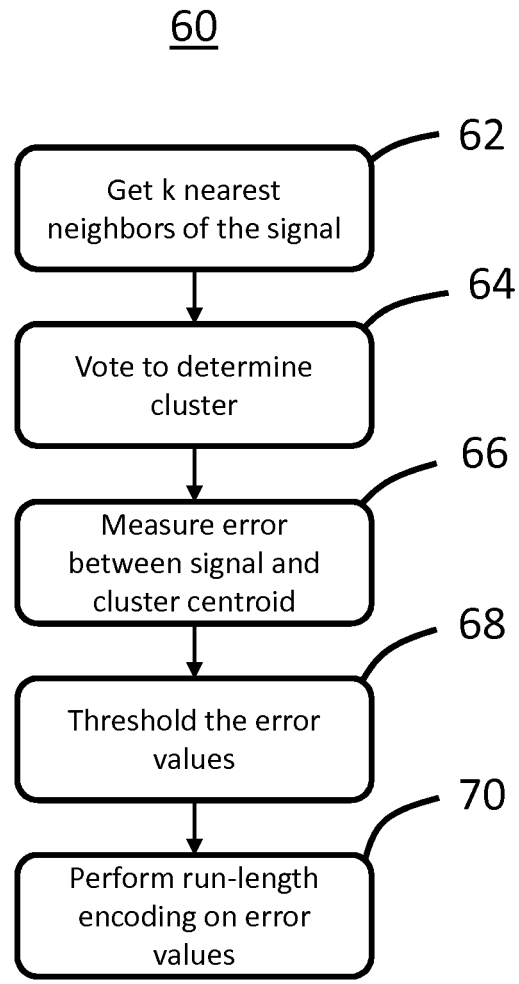
FIG. 5A
FIG. 5B

SYSTEMS AND METHODS FOR COMPRESSING SENSOR DATA USING CLUSTERING AND SHAPE MATCHING IN EDGE NODES OF DISTRIBUTED COMPUTING NETWORKS

CROSS-REFERENCE TO PRIOR APPLICATIONS

This application is the U.S. National Phase application under 35 U.S.C. § 371 of International Application No. PCT/EP2019/071013, filed on Aug. 5, 2019, which claims the benefit of U.S. Provisional Application No. 62/715,462, filed on Aug. 7, 2018 and European Patent Application No. 18190898.9, filed on Aug. 27, 2018. These applications are hereby incorporated by reference herein.

FIELD OF THE INVENTION

The present disclosure is directed generally to distributed computing systems, and more particularly to compressing sensor data at an edge node using clustering and shape matching.

BACKGROUND

There is an on-going trend in many industries to communicably connect together an increasingly large number of different devices that were traditionally non-connected. Examples include home and building control systems, such as connected lighting systems, inventory tracking systems, the "internet of things", and/or other "smart" or "connected" systems. Typically, the edge nodes of these systems (e.g., the luminaires in a connected lighting system) include sensors and communication modules that enable the system as a whole to more effectively, efficiently, and/or automatically react to dynamic changes in the relevant environment (e.g., home, office, warehouse, etc.). In order to make these systems feasible (e.g., economical), one typical characteristic of these systems is the limited availability of computational resources at the edge nodes (e.g., at the luminaires in a connected lighting system) and the low power bandwidth with which the nodes of the system are interconnected.

One method to address the constraints imposed by the limited resources of a connected system includes compression techniques in which the raw collected sensor data is compressed at the edge, and then transferred to centralized or designated network infrastructure, such as a local server or the cloud, for decompression and analysis. However, as data is increasingly compressed (e.g., in order to be timely compressed and transferred over the limited bandwidth and computational resources at the edge nodes), there is a corresponding degradation in the accuracy of the data after decompression.

Accordingly, there is a continued need in the art for systems and methods to facilitate more timely, accurate, and efficient analysis of sensor data collected at resource-constrained edges nodes of distributed computing systems.

SUMMARY OF THE INVENTION

The present disclosure is directed to systems and methods for compressing sensor data at an edge node of a distributed computing system using clustering and shape matching. Various embodiments and implementations herein are directed to data compression and analysis methods in which unique patterns are identified in collected sensor data, which patterns correspond to particular events observed by the sensor. For example, sensor-enabled edge nodes of a distributed computing system are often installed such that their sensors are oriented, located, positioned, or otherwise arranged to collect data with respect to a particular geographic area or environment. It is thus expected that the sensor from any given edge node will frequently observe the same types of events, depending on where and/or how the corresponding edge node device is installed. In other words, there are a finite number of waveform shapes that a sensor positioned at any given location is expected or likely to generate during normal use.

According to the methods and systems disclosed herein, it is proposed that each of the different events observed by any given sensor are likely to correspond to, or can be associated with, a unique waveform or shape for the collected raw data signal. For example, a passive infrared (PIR) or other motion sensor, e.g., in a connected lighting system, may observe unique shapes of analog responses based on the location of the sensor relative to the typical movement patterns of people in the space (e.g., moving in one more directions, typing or working while seated at a desk, interacting in a group meeting, jumping up and down, falling down etc.). Patterns of other non-movement related events, such as identifying the ambient weather conditions (e.g., raining, snowing, sunny, cloudy, etc.) can be detected based on other temperature, humidity, thermopile sensors etc.

In this way, any newly collected raw data signal can be compared to a generic template (or centroid) for each of the known unique waveforms or shapes to determine (probabilistically guess or estimate) which event is occurring. In one embodiment, a dynamic time warping (DTW) metric can be utilized to determine a time-independent data signal that enables similar events to be clustered or classified, regardless of the movement speed, timing, or duration of the entity or phenomena being observed to generate the raw data signal. In one embodiment, the identified event or unique waveform is utilized to select a corresponding compression scheme. For example, there may be a correlation between the unique waveform or shape of a raw data signal and the ability to accurately compress and decompress that raw data signal with respect to different compression schemes. In one embodiment, the amount of data produced by and/or transmitted over the distributed network is reduced by sending only the error between the raw data signal and the centroid to which it is correlated.

All examples and features mentioned below can be combined in any technically possible way.

Generally, in one aspect, a method of compressing sensor data at an edge node of a distributed computing network is provided. The method includes training the edge node with knowledge of a plurality of known signal templates, each known signal template corresponding to one of a plurality of events observable by a sensor of the edge node; collecting a raw data signal by the sensor; classifying the raw data signal to one of the known signal templates based on a degree of similarity between the raw data signal and the known signal template; selecting a compression scheme based on the classification of the raw data signal; and compressing the raw data signal in accordance with the compression scheme.

According to an embodiment, the compressing includes compressing only a difference between the raw data signal and the classified known signal template. In one embodiment, the classifying includes determining which event is observed based on the classified known signal template, and the compressing includes an indication of the event observed by the sensor. In one embodiment, the classifying includes utilizing a k-nearest neighbor algorithm.

According to an embodiment, the classifying includes dynamic time warping or any scale invariance metric. In one embodiment, the distributed computing network is a connected lighting system and the sensor is a passive infrared sensor. In one embodiment, the training includes collecting a plurality of data signals and clustering the data signals with respect to a plurality of clusters, and creating a centroid for each cluster from the data signals in that cluster, wherein the known signal templates comprise the centroids.

Generally, in another aspect, a method of analyzing analog responses of a passive infrared (PIR) sensor at an edge node of a distributed network is provided. The method includes collecting an analog data signal as an analog portion of a response from the PIR sensor detecting movement with respect to the sensor; processing the analog data signal with dynamic time warping to compare the analog data signal to a plurality of known signal templates, each known signal template comprising a data set describing a type of movement detected with respect to the PIR sensor; identifying a matching one of the known signal templates that most closely resembles the analog data signal using a pattern recognition algorithm; determining the type of movement detected based on the matching one of the known signal templates; and transmitting an indication of the type of movement, the indication of the type of movement being a compressed representation of the analog data signal.

Generally, in a further aspect, an edge node for a distributed computing network is provided. The edge node includes a communication module configured to enable data communication with the distributed computing network; a sensor configured to collect a raw data signal based on an event observed by the sensor; a controller configured to compare the raw data signal to a plurality of known signal templates; identify a matching one of the known signal templates that most closely resembles the raw data signal; select a compression scheme based on the matching one of the known signal templates; and compress the raw data signal in accordance with the compression scheme.

According to an embodiment, the controller is further configured to compress only a difference between the raw data signal and the matching one of the known signal templates. In one embodiment, the controller is configured to compress the raw data signal by determining the event that is observed based on the matching one of the known signal templates, and determining the event or an indication representative of the event. In one embodiment, the controller comprises a k-nearest neighbor algorithm installed therein, and wherein the controller is configured to compare the raw data signal to the plurality of known signal templates using the k-nearest neighbor algorithm.

According to an embodiment, the controller comprises a dynamic time warping algorithm installed therein, and wherein the controller is configured to compare the raw data signal to the plurality of known signal templates using the dynamic time warping algorithm. In one embodiment, the distributed computing network is a connected lighting system and the sensor is a passive infrared sensor coupled to a luminaire.

Generally, in another aspect, a distributed computing network comprising a plurality of edge nodes as disclosed herein communicably connected together is provided.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

FIG. 5A illustrates a method of performing a training phase for an edge node according to one embodiment disclosed herein.

FIG. 5B illustrates a method of performing an operational phase for an edge node according to one embodiment disclosed herein.

DETAILED DESCRIPTION OF EMBODIMENTS

Figure 1:
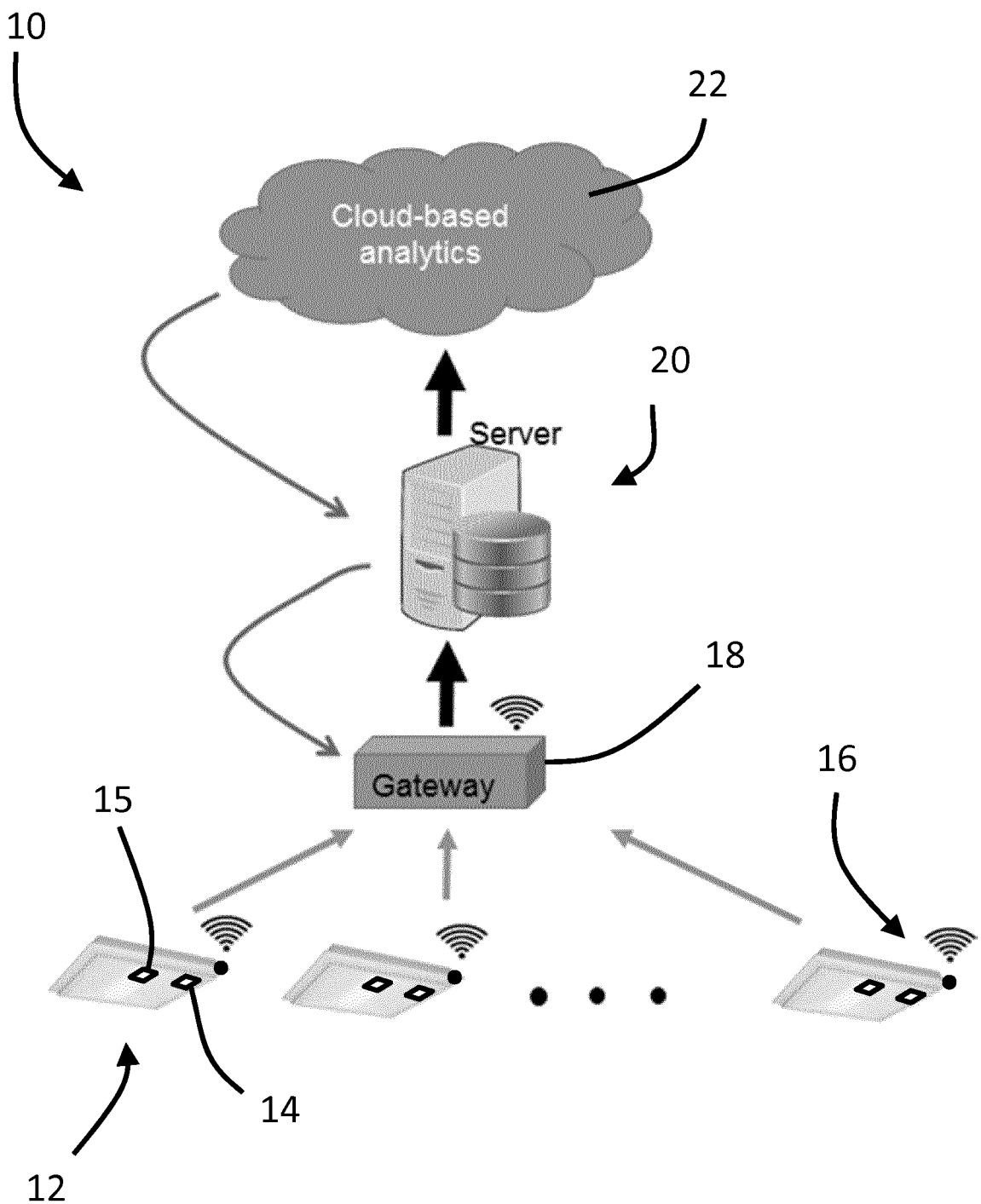
FIG. 1 schematically illustrates a distributed computing network having a plurality of edge nodes according to one embodiment disclosed herein.

The present disclosure describes various embodiments of data compression using the edge nodes of a distributed computing network. More generally, Applicant has recognized and appreciated that it would be beneficial to edge nodes configured to perform clustering and shape matching on collected data signals. A particular goal of utilization of certain embodiments of the present disclosure is to reduce the amount of data produced and transmitted by the edge nodes of a distributed network and to enable resource-constrained edge node devices to perform local activity or event recognition.

In view of the foregoing, various embodiments and implementations are directed to data compression and analysis methods in which patterns are identified in collected sensor data, where these patterns correspond to particular events observed by the sensor. For example, sensor-enabled edge nodes of a distributed computing system are often installed such that their sensors are oriented, located, positioned, or otherwise arranged to collect data with respect to a particular geographic area or environment. It is thus expected that the sensor from any given edge node will frequently observe the same types of events, depending on where and/or how the corresponding edge node device is installed. In other words, most of the activity that a sensor positioned at any given location is expected or likely to generate are of a finite or very limited number of waveform shapes, relative to some scale invariance e.g. time (DTW), during normal use.

According to the methods and systems disclosed herein, it is proposed that each of the different events observed by any given sensor are likely to correspond to, or can be associated with, a unique waveform or shape for the collected raw data signal. For example, a passive infrared (PIR) or other motion sensor, e.g., in a connected lighting system, may observe unique shapes of the analog portion of the responses from the PIR or other sensor based on the location of the sensor relative to the typical movement patterns of people in the space (e.g., moving in one more directions, typing or working while seated at a desk, interacting in a group meeting, etc.). Patterns for other data types can also be used to identify non-movement related events, such as identifying the ambient weather conditions (e.g., raining, snowing, sunny, cloudy, etc.) based on temperature, humidity, etc.

In this way, any newly collected raw data signal can be compared to a generic template (or centroid) for each of the known unique waveforms or shapes to determine (probabilistically guess or estimate) which event is occurring. In one embodiment, a dynamic time warping (DTW) metric can be utilized for time-invariance in the data shape that enables similar events to be clustered or classified, regardless of the movement speed, timing, or duration of the entity or phenomena being observed to generate the raw data signal. While time-invariance is one example, other scale invariance methods can be considered e.g. amplitude or higher order combination of amplitude and time. In one embodiment, the identified event or unique waveform is utilized to select a corresponding compression scheme. For example, there may be a correlation between the unique waveform or shape of a raw data signal and the ability to accurately compress and decompress that raw data signal with respect to different compression schemes. In one embodiment, the amount of data produced by and/or transmitted over the distributed network is reduced by sending only the error between the raw data signal and the centroid to which it is correlated.

Referring to FIG. 1, in one embodiment, a distributed computing network or system 10 having a plurality of edge nodes 12 is provided. In particular, FIG. 1 illustrates the computing system 10 as a connected lighting system, with the edge nodes 12 provided as luminaires. However, it is to be appreciated that any other connected or "smart" computing system may be utilized, e.g., building control systems such as for automating heating, cooling, ventilation, security, noise suppression, etc., or other computing systems such as inventory tracking systems, the Internet of Things, etc. At a minimum, each of the edge nodes 12 includes a sensor 14 (or multiple sensors) configured to collect data related to one or more parameters pertaining to the surrounding environment, a controller 15 configured to control operation of the respective edge node 12, and a communication interface or module 16 that enables data communication between the edge nodes 12 and/or with other nodes or devices.

The system 10 may be arranged as a peer-to-peer network of the edge nodes 12 and/or include one or more centralized nodes if desired. The term "centralized node" as used herein is intended to broadly refer to any designated network or processing equipment. Examples include a gateway 18, a server 20 (e.g., local network server), and a cloud computing implementation 22 (alternatively, the "cloud 22"). Thus, the centralized nodes generally provide additional computing resources for higher level processing needs, control operation of the system 10, enable certain features of the system 10, facilitate network traffic, etc. It is to be appreciated that the system 10 may include one or both of the server 20 and the cloud 22, which separately and/or together provide centralized computing resources for the system 10. For example, the central server 20 and/or the cloud 22 can be included to decompress and/or analyze the data collected by the sensors 14 and compressed at the edge nodes 12 as discussed in more detail herein.

It is to be appreciated that each of the edge nodes 12, the gateway 18, the server 20, and/or the cloud 22 may include suitable hardware and software to embody and enable the structure, features, and functionality disclosed herein. For example, each of the gateway 18, the server 20, and the cloud 22 may include sensors, controllers, and communication modules akin to (e.g., but having more computational resources than) those described with respect to the edge nodes 12. Any such controllers may be, or include, a processor, memory, algorithm, or other hardware or software component.

Processors (e.g., for the controllers 15) may take any suitable form, such as a microcontroller, plural microcontrollers, circuitry, a single processor, or plural processors configured to execute software instructions. Similarly, memory (e.g., for the controllers 15) may take any suitable form or forms, including a volatile memory, such as random access memory (RAM), or non-volatile memory such as read only memory (ROM), flash memory, a hard disk drive (HDD), a solid state drive (SSD), or other data storage media. Memory may be used by a processor for the temporary storage of data during its operation. Data and software, such as the algorithms or software necessary to perform the methods and provide the features and functionality discussed herein, as well as an operating system, firmware, or other application, may be installed in memory. Communication modules as referred to herein (e.g., the communication modules 16) are arranged to enable communication between the components of the system 10. The communication module may be or include any module, device, or means capable of enabling the transmission and/or reception of a wired or wireless communication signal, e.g., a transmitter, receiver, transceiver, antenna, etc., utilizing technologies that include, but are not limited to Wi-Fi (e.g., IEEE 802.11), Bluetooth, cellular, Ethernet, Zigbee, etc. As discussed herein, of particular note are the more relatively low-power or resource constrained technologies, such as Zigbee.

The sensors 14 can be configured to collect any desired or selected data parameter related to the local environment, such as motion detection (e.g., radiated infrared energy), temperature, humidity, ambient noise level, ambient light level, etc. In one embodiment, particularly in which the system 10 is a connected lighting system, the sensors 14 may include passive infrared (PIR) sensors. However, those of ordinary skill in the art will recognize other sensors, such as thermopiles, cameras, microphones, etc., which can be used as the sensors 14. The system 10 may be arranged to utilize this data to automate or make more efficient certain features or functionality of its components, such as the edge nodes 12. For example, referring back to an embodiment in which the system 10 is a connected lighting system, the sensors 14 may be motion detection sensors that enable the system 10 to automatically turn lights on upon detection of movement and/or to turn off lights after a preset period of time elapses in which movement is not detected. Those of ordinary skill in the art will recognize other types of distributed computing systems and collected data that can be utilized to facilitate operation of these other systems.

It is also to be appreciated that the system 10 may be equipped with algorithms related to artificial intelligence, machine learning, artificial neural networks, etc. in order to enable advance decision making analytics and determination, such as context awareness, activity, event, or scene recognition, etc., based on the collected data. In one example, one or more algorithms may be utilized (e.g., by the server 20 and/or the cloud 22) to process the data collected by the sensors 14 to attempt to make a higher level determination or probabilistic guess as to a corresponding activity or scenario based on that data. For example, collected motion detection data may be analyzed to estimate a number of occupants in one or more designated areas. While motion detection data only indicates detected motion, the data can be analyzed for patterns that the algorithm learns, or is trained to, recognize or correlate to a corresponding event (or a likelihood of the corresponding event occurring), such as occupant count. For example, higher levels of detected motion in a concentrated area may be interpreted as or correlated to a larger estimated occupant count. It is to be appreciated that this is merely one example and many other possibilities of higher level determinations made from collected sensor data will be appreciable to those of ordinary skill in the art.

Figure 2:
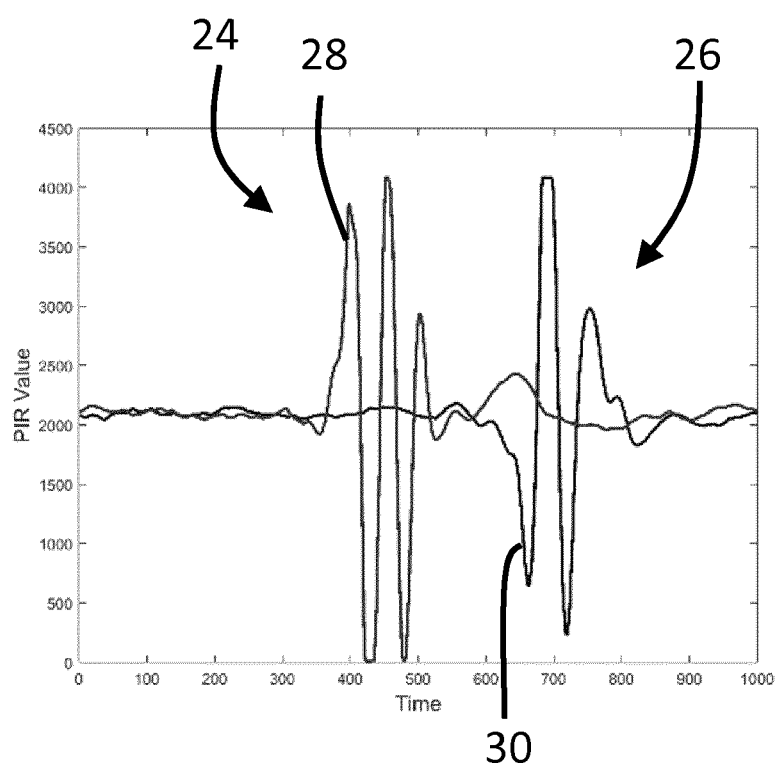
FIG. 2 is a graph illustrating an example of two data signals collected by the sensors of the edge nodes of a distributed computing network.

As noted above, it is expected that any given sensor is likely to commonly or frequently observe only a finite or limited number of different events, and that each of these events can be described by, or associated with, a unique waveform. To this end, FIG. 2 graphically represents an example of two raw data signals 24 and 25 collected by the sensor 14, which each forms its own unique shape. For example, the raw data signals 24 and 25 may be the analog portion of the responses of a PIR sensor pertaining to two different movement events observed by the sensor. In this example, the raw data signal 24 may correspond to a first event in which a person is moving in a first direction with respect to the sensor 14 (e.g., left to right), while the raw data signal 25 corresponds to a second event in which a person is moving in a second direction with respect to the sensor 14 (e.g., right to left). Those of ordinary skill in the art will recognize any number of other events that can be observed by motion detection or other sensors.

The unique shapes can be defined and identified by any number of different features or characteristics. For example, with respect to time, the raw data signal 24 includes a first major peak 26 that extends in the positive Y-axis direction, while the raw data signal 25 includes a first major peak 28 that extends in the negative Y-axis direction. Other characteristics may include the magnitude of the peaks, the relative width and/or spacing between peaks, the number of peaks, etc.

Figure 3:
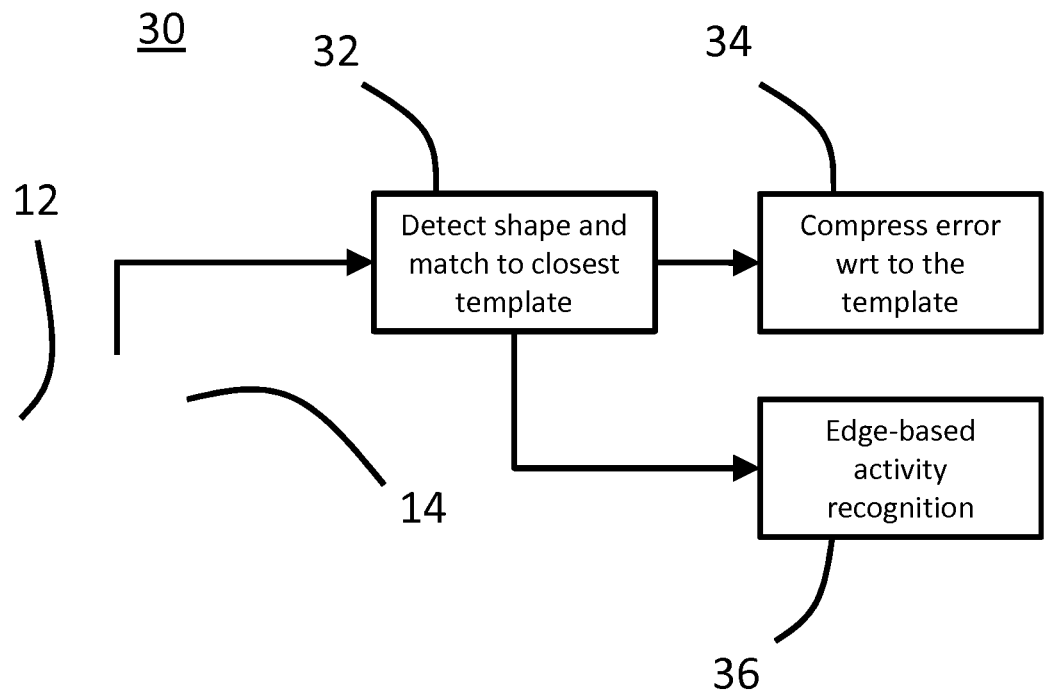
FIG. 3 is a flowchart illustrating a method of using shape matching and clustering to improve the ability of edge nodes to compress data and perform activity recognition using minimal computing resources.

FIG. 3 illustrates a method 30 according to one embodiment in which the edge node 12 is arranged as a luminaire or light fixture, and which includes or is communicably coupled to the sensor 14, e.g., a motion detection sensor. At step 32, the edge node 12 (e.g., via the controller 15) analyzes the raw data signal generated by the sensor 14 and detects or determines a shape of the raw data signal (e.g., as defined by one or more features or characteristic, such as the first major peaks 26 and 28 as discussed above).

As part of the analysis of step 32, the shape of the raw data signal may be matched to one of a plurality of known templates based on a degree of similarity between the shape of the raw data signal and the known templates. For example, the raw data signal may be matched to whichever of the known templates the shape of the data signal most closely resembles. If desired, the step 32 may include performing dynamic time warping on the signal to normalize the raw data signal with respect to time (i.e., to make the raw data signal time-independent). As one non-limiting example, dynamic time warping can be utilized to enable the shapes generated due to people moving in a given direction closely resemble or correlate to each other regardless of the movement speed of the people.

For example, with respect to DTW, consider two time series Q and C of the same length n, where $Q=q_1, q_2, \ldots, q_n$ and $C=c_1, c_2, \ldots, c_n$. An n×n matrix whose $(i,j)^{th}$ element is the Euclidean distance between $q_i$ and $c_j$. A path through this matrix can be found that minimizes the cumulative distance. This path then determines the optimal alignment between the two time series. It should be noted that it is possible for one point in a time series to be mapped to multiple points in the other time series. For example, a path W can be created, where $W=w_1, w_2, \ldots, w_K$ and each element of W represents the distance between a point i in Q and a point j in C, i.e., $w_k=(q_i-c_j)^2$. Minimization of the Euclidean distance can be achieved via dynamic programming in O(nm) time where n and m are the length of the two sequences.

The method 30 may also include a step 34 at which the raw data signal is compressed with respect to the identified template. For example, since the templates are known shapes, the differences or error between the raw data signal and the closest template can be determined. These differences will be a smaller data size than the raw data signal itself. Thereafter, the errors can be compressed, and the compressed errors transmitted to a centralized node for reconstruction and analysis. Advantageously, the compressed errors and identity of the closest template are sufficient to reconstruct the signal with high accuracy while using less computing resources and bandwidth (as opposed to compressing and transmitting the entire raw data signal). It is to be appreciated that alternatives to that disclosed can be used in other embodiments. For example, in one embodiment, instead of compressing just the error, the entire raw data signal is compressed and transmitted.

Instead of, or in addition to, compressing the some or all of the raw data signal (e.g., as in step 34), step 36 may be included, which involves performing activity recognition based on the collected data set. In other words, step 36 may include making a determination as to the event being observed by the sensor 14 based on the collected raw data signal. For example, if each of the known templates or centroids is associated with a different event, then the edge nodes can determine which event is being observed based on which cluster the raw data signal is assigned to as a result of step 32. In this example, just an indicator of the observed event can be transmitted to a centralized node for processing (e.g., without any other data).

As one non-limiting example, a sensor, such as a PIR sensor, camera, etc., may be positioned at a one-way exit and the direction of movement of people assessed in accordance with the embodiments disclosed herein to determine whether each person is moving in a proper direction or a prohibited direction. Instead of compressing and transmitting each collected data signal (or a portion thereof) for processing, just the determination as to the direction of movement of each person can be transmitted. If this determination indicates a person moving in the prohibited direction, it can be utilized to trigger some action, such as an alarm. While sending just the determination of the event may not resemble traditional "data compression" schemes (e.g., there is no corresponding decompression), it would effectively reduce the amount of data that needs to be transferred over the distributed network 10, and therefore for the purposes herein shall be considered as a data compression scheme (e.g., the raw data signal is reduced down into as little as a single value representing the observed event).

Figure 4:
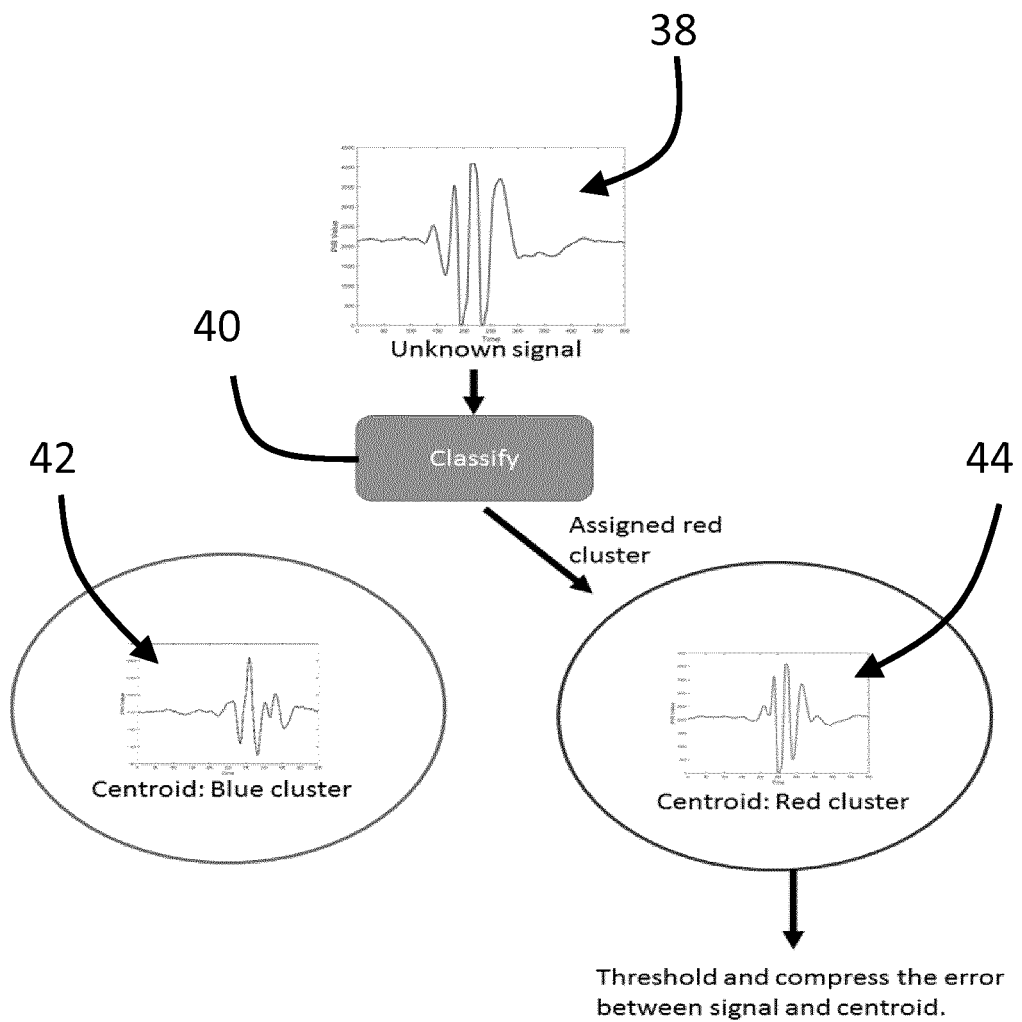
FIG. 4 illustrates a method of classifying an unknown data signal into a cluster according to one example provided herein.

Implementation of shape matching and clustering (e.g., step 32) can be better appreciated in view of FIG. 4, which illustrates in more detail one example of how a raw data signal can be classified. In this example, an unknown (unclassified) data signal 38 is received by a classifier 40 (e.g., implemented as or by the controller 15). For example, in this example the classifier 40 has knowledge of two known templates or centroids 42 and 44 (labeled as "Blue cluster" and "Red cluster", respectively). For example, the known templates may be stored as arrays, matrixes, or vectors of data pair values (e.g., each pair containing an observed sensor value with respect to time). It is to be appreciated that any number of known templates may be known to the classifier 40 (e.g., stored in memory in communication with the controller 15) and provided with any other label or description.

In the illustrated example of FIG. 4, the unknown signal 38 most closely matches or resembles the centroid 44, so it is assigned to the corresponding cluster (e.g., the "red cluster"). For example, the classifier 40 may utilize a pattern recognition algorithm such as k-Nearest Neighbors (k-NN) to identify which of the centroids the unknown signal 38 most closely matches. It is to be appreciated that any other pattern recognition or other algorithm configured to compare and correlate the similarity of two data sets may be used. As noted above, the difference or error between the unknown signal 38 and the matching centroid (in this case the centroid 44), can be determined and compressed according to a desired compression scheme, then transmitted (along with the identity of the matching centroid) to a centralized node for reconstruction and analysis.

The systems and methods disclosed herein may include a training phase and an operational phase. For example, in the training phase, the edge nodes 12 each create or are provided with an understanding of the unique patterns (known templates) that the sensor 14 of each edge node is likely to create, given the unique location and observed data type (e.g., detected movement, temperature, humidity, ambient noise level, etc.).

FIG. 5A illustrates a training phase according to one embodiment, which can be implemented by a method 50. At step 52, one or more edge nodes (e.g., the edge nodes 12) collect the raw data signals from their corresponding sensors (e.g., the sensors 14) over a period of time. At step 54, a clustering process may be employed on the raw data signals, such as a k-means clustering for different values of k. Those of ordinary skill in the art will recognize other methods for clustering and/or identifying patterns in the raw data signal, such as machine learning and/or unsupervised learning algorithms, or even manual review and selection. As noted above, dynamic time warping may be utilized to standardize similarly shaped signals with respect to time.

At step 56, the raw data signals are clustered in a selected or identified number ('k') of different shapes. If a k-means clustering algorithm is utilized, then the value of k that provides the best clustering of data can be used in step 56 to denote the number of unique patterns typically experienced by the corresponding sensor. The values of the members of each cluster can be averaged to create a centroid for each of the unique patterns, which centroid can be set as the template for the corresponding pattern. In addition to the centroid, the edge node may retain one or more other representative samples for each cluster.

As the edge node enters the operational phase after completing training (e.g., in accordance with the method 50), it is thus aware of the unique shapes that collected raw data signal are most likely to take. Given this knowledge, the edge node is able to classify a new or unknown raw data signal that needs to be compressed into one of the shapes identified in the training phase.

A method 60 describing the operational phase according to one embodiment is depicted in FIG. 5B. At step 62, a k-nearest neighbors algorithm (e.g., as discussed above) may be employed in this embodiment to analyze the unknown raw data signal (although other pattern recognition algorithms may alternatively be employed). At step 64, the appropriate cluster for the unknown raw data signal is determined, e.g., by voting in accordance with k-NN. Once the cluster is identified, the centroid (e.g., as created in step 58 of the training method 50) acts as an approximation for the raw data signal being compressed. The difference (or error) between the unknown signal and the cluster centroid is can be determined at step 66. The differences may be processed using any desired technique or methodology. For example, in the method 60 thresholding may occur at step 68 and run-length encoding at step 70.

Figure 6:
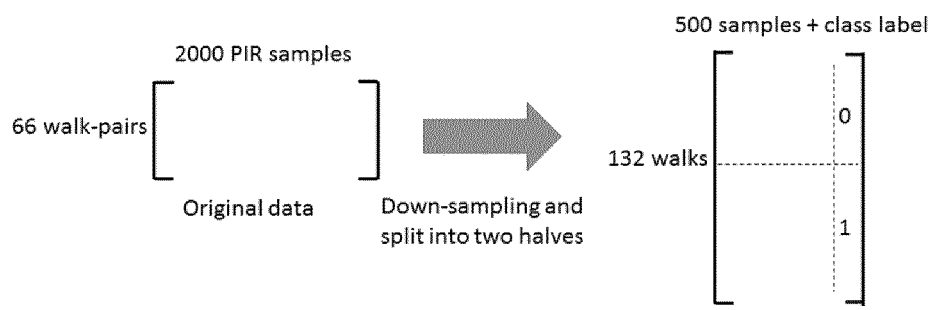
FIG. 6 representatively illustrates data collection and manipulation for one experiment described herein.
Figure 7:
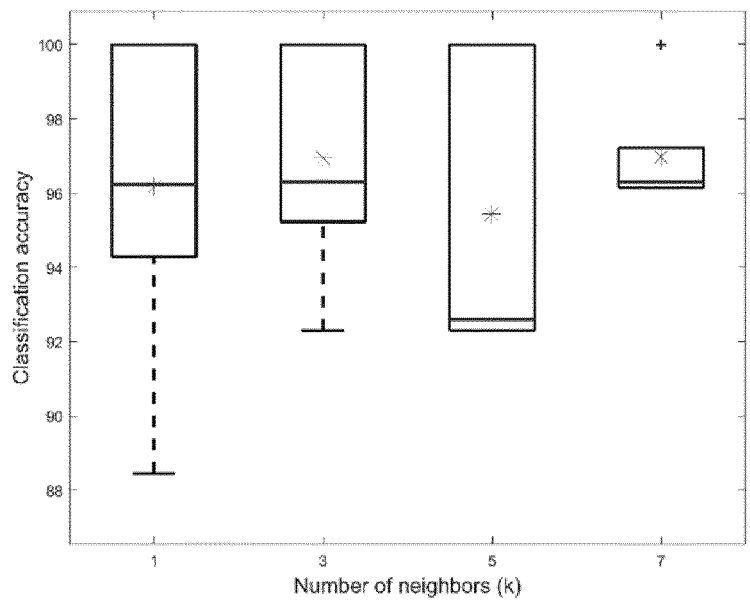
FIG. 7 illustrates the results of a k-nearest neighbor analysis performed on the representative data set of FIG. 6.

An experiment was performed that entailed four subjects walking across the field of vision of a wall-mounted PIR sensor, the results of which are shown in FIG. 6. More particularly, each walk generated a signal of 2000 samples that spanned across two PIR pulses: for the subject walking Left to Right ('0'), and for the subject walking back from Right to Left ('0'). A total of sixty-six walks were conducted by the four subjects. The resulting data was down-sampled and cut into two halves for the two classes ('0' and '1'). The resulting dataset had 132 signals, each having a length of 500 samples, and a binary value indicating which of the two classes was identified ('0' or '1'). This data was subjected to DTW-based k-NN classification. The results for different values of k are shown in FIG. 7. As can be appreciated in view of the FIG. 7, the two classes of signals were able to be separated with a high degree of accuracy. Thus, these two classes (Left-to-Right or '0', and Right-to-Left or '1') can be used as the clusters for compression. In this way, any given unknown signal can be readily classified into these two classes and then compressed as described in the previous section.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed.

Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. As used herein in the specification and in the claims, "or" should be understood to have the same meaning as "and/or" as defined above.

It should also be understood that, unless clearly indicated to the contrary, in any methods claimed herein that include more than one step or act, the order of the steps or acts of the method is not necessarily limited to the order in which the steps or acts of the method are recited.

The invention claimed is:

1. A method of compressing sensor data at an edge node of a distributed computing network, comprising:
   training the edge node with knowledge of a plurality of known signal templates, each known signal template corresponding to one of a plurality of events previously sensed by a sensor of the edge node positioned at a fixed location over time;
   collecting a raw data signal by the sensor positioned at the fixed location;
   comparing the raw data signal against the plurality of known signal templates based on a degree of similarity between the raw data signal and each one of the plurality of known signal templates;
   classifying the raw data signal as being related to one of the plurality of known signal templates based on a highest degree of similarity between the raw data signal and a particular known signal template of the plurality of known signal templates, and determining which event of the plurality of events is observed based on the particular known signal template;
   selecting a compression scheme based on the classification of the raw data signal; and
   compressing only a difference between the raw data signal and the particular known signal template in accordance with the compression scheme, the compressing including an indication of the event observed by the sensor.

2. The method of claim 1, wherein the classifying includes utilizing a k-nearest neighbor algorithm.

3. The method of claim 1, wherein the classifying includes dynamic time warping or any scale invariance metric.

4. The method of claim 1, wherein the distributed computing network is a connected lighting system and the sensor is a passive infrared sensor.

5. The method of claim 1, wherein the training includes collecting a plurality of data signals and clustering the data signals with respect to a plurality of clusters, and creating a centroid for each cluster from the data signals in that cluster, wherein the known signal templates comprise the centroids.

6. An edge node for a distributed computing network comprising:
   a communication transceiver configured to communicate data with the distributed computing network;
   a sensor configured to collect a raw data signal based on an event observed by the sensor, wherein the sensor and the edge node are positioned at a fixed location;
   a controller having a processor and memory configured to:
      compare the raw data signal to a plurality of known signal templates, wherein the plurality of known signal templates correspond to a plurality of events previously sensed by the sensor at the fixed location over time;
      identify a matching one of the plurality of known signal templates that most closely resembles the raw data signal, and determine the event of the plurality of events that is observed based on the matching one of the plurality of known signal templates;
      select a compression scheme based on the matching one of the plurality of known
      compress only a difference between the raw data signal and the matching one of the plurality of known signal templates in accordance with the compression scheme by the determined event and determining the event or an indication representative of the event.

7. The edge node of claim 6, wherein the controller comprises a k-nearest neighbor algorithm installed therein, and wherein the controller is configured to compare the raw data signal to the plurality of known signal templates using the k-nearest neighbor algorithm.

8. The edge node of claim 6, wherein the controller comprises a dynamic time warping algorithm installed therein, and wherein the controller is configured to compare the raw data signal to the plurality of known signal templates using the dynamic time warping algorithm.

9. The edge node of claim 6, wherein the distributed computing network is a connected lighting system and the sensor is a passive infrared sensor coupled to a luminaire.

10. A distributed computing network comprising a plurality of edge nodes according to claim 6 communicably connected together.

* * * * *